United States Patent
Kawakubo et al.

(10) Patent No.: US 7,772,745 B2
(45) Date of Patent: Aug. 10, 2010

(54) MEMS DEVICE WITH LOW OPERATION VOLTAGE, LARGE CONTACT PRESSURE FORCE, AND LARGE SEPARATION FORCE, AND PORTABLE COMMUNICATION TERMINAL WITH THE MEMS DEVICE

(75) Inventors: Takashi Kawakubo, Yokohama (JP);
Toshihiko Nagano, Kawasaki (JP);
Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/040,582

(22) Filed: Feb. 29, 2008

(65) Prior Publication Data
US 2008/0238257 A1 Oct. 2, 2008

(30) Foreign Application Priority Data
Mar. 27, 2007 (JP) ............... 2007-082045

(51) Int. Cl.
*H01L 41/08* (2006.01)
(52) U.S. Cl. ............... 310/330; 310/331; 310/332
(58) Field of Classification Search ........ 310/330–332
See application file for complete search history.

(56) References Cited

U.S. PATENT DOCUMENTS

| | | | | |
|---|---|---|---|---|
| 4,670,682 A | * | 6/1987 | Harnden et al. | 310/332 |
| RE33,691 E | * | 9/1991 | Harnden et al. | 310/332 |
| 6,057,520 A | * | 5/2000 | Goodwin-Johansson | 200/181 |
| 6,504,118 B2 | * | 1/2003 | Hyman et al. | 200/181 |
| 6,731,492 B2 | * | 5/2004 | Goodwin-Johansson | 361/233 |
| 6,828,888 B2 | * | 12/2004 | Iwata et al. | 335/78 |
| 7,053,737 B2 | * | 5/2006 | Schwartz et al. | 335/78 |
| 7,183,697 B2 | * | 2/2007 | Yonetake et al. | 310/330 |
| 7,242,273 B2 | * | 7/2007 | Isobe et al. | 335/78 |
| 7,345,404 B2 | * | 3/2008 | Klee et al. | 310/330 |

(Continued)

FOREIGN PATENT DOCUMENTS

JP 08-506690 7/1996

(Continued)

OTHER PUBLICATIONS

Japanese Office Action dated Jun. 19, 2009 corresponding to U.S. Appl. No. 12/040,582, filed Feb. 29, 2008.

(Continued)

*Primary Examiner*—J. SanMartin
(74) *Attorney, Agent, or Firm*—Turocy & Watson, LLP

(57) ABSTRACT

It is made possible to provide a MEMS device that has a low operation voltage, a large contact pressure force, and a large separation force. A MEMS device includes: a substrate; a supporting unit that is provided on the substrate; a fixed electrode that is provided on the substrate; an actuator that includes a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode; and a stopper unit that is located above a straight line connecting the supporting unit and the fixed electrode, and is located on the substrate so as to face the first electrode.

14 Claims, 12 Drawing Sheets

U.S. PATENT DOCUMENTS

| | | | |
|---|---|---|---|
| 7,471,176 B2 * | 12/2008 | Bunyan et al. | 335/78 |
| 7,495,368 B2 * | 2/2009 | Gogoi et al. | 310/300 |
| 7,501,920 B2 * | 3/2009 | Yuba et al. | 335/78 |
| 2006/0067840 A1 | 3/2006 | Kawakubo et al. | |
| 2006/0285255 A1 | 12/2006 | Kawakubo et al. | |
| 2007/0024403 A1 | 2/2007 | Kwon et al. | |
| 2007/0228887 A1 | 10/2007 | Nishigaki et al. | |
| 2008/0042521 A1 | 2/2008 | Kawakubo et al. | |
| 2008/0074006 A1 | 3/2008 | Kawakubo et al. | |

FOREIGN PATENT DOCUMENTS

| | | |
|---|---|---|
| JP | 2002326197 | 11/2002 |
| JP | 2007035640 | 2/2007 |
| KR | 200713950 | 1/2007 |
| WO | 94/19819 | 9/1994 |

OTHER PUBLICATIONS

Korean Office Action dated Feb. 16, 2010 corresponding to U.S. Appl. No. 12/040,582, filed Feb. 29, 2008.

* cited by examiner

MEMS DEVICE WITH LOW OPERATION VOLTAGE, LARGE CONTACT PRESSURE FORCE, AND LARGE SEPARATION FORCE, AND PORTABLE COMMUNICATION TERMINAL WITH THE MEMS DEVICE

CROSS-REFERENCE TO RELATED APPLICATION

This application is based upon and claims the benefit of priority from prior Japanese Patent Application No. 2007-82045 filed on Mar. 27, 2007 in Japan, the entire contents of which are incorporated herein by reference.

BACKGROUND OF THE INVENTION

1. Field of the Invention

The present invention relates to a MEMS device and a portable communication terminal that includes the MEMS device.

2. Related Art

MEMS (Micro-Electro-Mechanism System) utilizing a semiconductor process is expected to be applied in various fields. For example, in the field of high-frequency circuits, applications of MEMS devices as RF switches and variable capacitors are strongly expected.

MEMS switches for high-frequency waves are roughly divided into the group of DC contact MEMS switches that can be used with DC and high-frequency waves and each have two contact points in ohmic contact with each other, and the group of capacitive switches that can be used only at high frequencies of 10 GHz or higher and each have two contact points in contact with each other via a thin dielectric film. Since consumer portable wireless devices normally use 500 MHz to 5 GHz bands, DC contact MEMS switches serve more uses.

As the related driving mechanisms for DC contact MEMS switches, electrostatic driving mechanisms have been mostly used. This is because electrostatic driving mechanisms have simple materials and structures, and processing with an electrostatic driving mechanism is easy. A typical structure of an electrostatic driving mechanism has a fixed electrode formed on a substrate and covered with a dielectric film. A contact electrode for ohmic contact is also formed on the substrate, and a conductive movable beam bridging the upper portions of the fixed electrode and the contact electrode with a weak spring is provided. A voltage is applied between the fixed electrode and the movable beam, so as to generate an electrostatic force. The contact electrode and the movable electrode of the movable beam are attracted to each other by the electrostatic force, and are brought into ohmic contact with each other. In this manner, the switch is opened and closed.

FIG. 14 schematically shows the spring force of the movable beam, the electrostatic force, and the sum of the two forces. To maintain isolation of a MEMS switch, it is necessary to move the movable beam by 2 μm to 3 μm. However, the electrostatic driving force rapidly decreases in inverse proportion to the square of the distance between the contact electrode and the movable electrode. Therefore, the spring constant becomes relatively smaller, and a high voltage of 20 V or more is constantly required as the electrostatic driving voltage. When the contact electrode and the movable electrode of the movable beam are brought into contact with each other, a strong contact pressure force is generated. However, the separating process depends only on the spring force, resulting in the problems that the separation force is very weak, the contact points are fixed, and the reliability is low. To sum up, an electrostatically-driven MEMS switch has the advantage that the contact pressure force is large, but has the disadvantages that the driving voltage is high and the separation force is weak.

Meanwhile, piezoelectric driving systems have been suggested as MEMS driving mechanisms. A piezoelectric driving system has a piezoelectric film interposed between electrode films in a movable beam as a piezoelectric driving mechanism. A movable electrode is provided on the movable beam, and a fixed electrode is provided on the substrate. The spring force of the movable beam is the linear function of the distance between the movable electrode and the fixed electrode. FIG. 15 schematically shows the spring force of the movable beam, the piezoelectric driving force, and the sum of the two forces. The piezoelectric driving force is constant in direct proportion to the voltage, and a relatively low voltage can cause a great change of the piezoelectric driving force. However, the driving force is weak, and the contact pressure force and the separation force are accordingly small. To sum up, a piezoelectrically-driven MEMS switch has the advantage that the driving voltage is low, but has the disadvantages that the contact pressure force and the separation force are weak.

To counter this problem, a hybrid driving mechanism using both electrostatic and piezoelectric forces has been suggested, with the advantages of electrostatic driving and piezoelectric driving being combined (see JP-A 8-506690 (KOKAI)). FIG. 4 of JP-A 8-506690 (KOKAI) shows the spring force of the driving beam, the electrostatic driving force, the piezoelectric driving force, and the sum of the three forces. As shown in FIG. 4 of JP-A 8-506690 (KOKAI), when the movable beam is away from the fixed electrode, driving is performed mainly by the piezoelectric force. When the movable beam is close to the fixed electrode, driving is performed mainly by the electrostatic force. Accordingly, it is possible to employ a driving beam having a greater spring constant than the spring constant used in a case where only one of the two forces is used. However, there still remains the problem of the weak separation force. To sum up, a hybrid-driven MEMS switch utilizing both electrostatic and piezoelectric forces has the advantages that the driving voltage is low and the contact pressure force is large, but has the disadvantage that the separation force is rather weak.

SUMMARY OF THE INVENTION

The present invention has been made in view of these circumstances, and an object thereof is to provide a MEMS device that has a low operation voltage, a large contact pressure force, and a large separation force, and a portable communication terminal that includes the MEMS device.

A MEMS device according to a first aspect of the present invention includes: a substrate; a supporting unit that is provided on the substrate; a fixed electrode that is provided on the substrate; an actuator that includes a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode; and a stopper unit that is located above a straight line connecting the supporting unit and the fixed electrode, and is located on the substrate so as to face the first electrode.

A MEMS device according to a second aspect of the present invention includes: a substrate; first and second supporting units that are provided at a distance from each other on the substrate; a first fixed electrode that is provided between the first supporting unit and the second supporting unit on the substrate; a second fixed electrode that is provided between the first fixed electrode and the second supporting unit on the substrate; a first contact electrode that is provided between the first fixed electrode and the second fixed electrode; a first stopper unit that is located above a straight line connecting the first supporting unit and the second supporting unit, and is located on the opposite side of the first fixed electrode from the first contact electrode on the substrate; a second stopper unit that is located above the straight line connecting the first supporting unit and the second supporting unit, and is located on the opposite side of the second fixed electrode from the first contact electrode on the substrate; an actuator that includes a first electrode, a first piezoelectric film formed on the first electrode, and a second electrode formed on the first piezoelectric film, the actuator having two ends fixed onto the substrate with the first and second supporting units; and a second contact electrode that is provided on the actuator so as to face the first contact electrode.

A MEMS device according to a third aspect of the present invention includes: a substrate; first and second supporting units that are provided at a distance from each other on the substrate; a fixed electrode that is provided between the first supporting unit and the second supporting unit on the substrate; a first stopper unit that is located above a straight line connecting the first supporting unit and the second supporting unit, and is located between the fixed electrode and the first supporting unit on the substrate; a second stopper unit that is located above the straight line connecting the first supporting unit and the second supporting unit, and is located between the fixed electrode and the second supporting unit on the substrate; and an actuator that includes a first electrode, a first piezoelectric film formed on the first electrode, and a second electrode formed on the first piezoelectric film, the actuator having two ends fixed onto the substrate with the first and second supporting units.

A MEMS device according to a fourth aspect of the present invention includes: a substrate; a supporting unit that is provided on the substrate; a fixed electrode that is provided on the substrate; an actuator that includes a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode; and a stopper unit that is located above a straight line connecting the supporting unit and the fixed electrode, and is located on the actuator so as to face the substrate.

A portable communication terminal according to a fifth aspect of the present invention includes: a MEMS device according to any one of first to third aspects, the MEMS device serving as a RF switch or a variable capacitor.

DESCRIPTION OF THE EMBODIMENTS

The following is a description of embodiments of the present invention, with reference to the accompanying drawings.

First Embodiment

Figure 1:
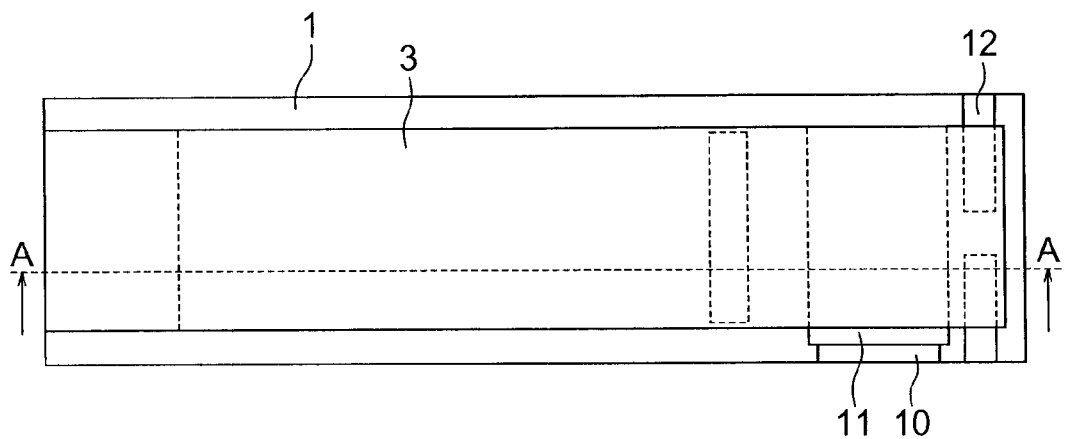
FIG. 1 is a plan view of a MEMS device in accordance with a first embodiment of the present invention.
Figure 2:
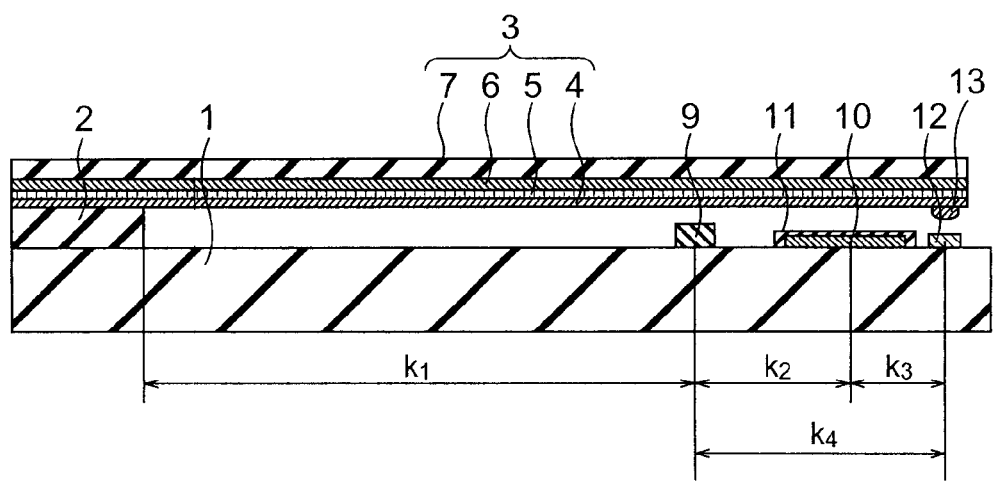
FIG. 2 is a cross-sectional view of the MEMS device in accordance with the first embodiment.

FIG. 1 is a plan view of a MEMS device in accordance with a first embodiment of the present invention. FIG. 2 is a cross-sectional view of the MEMS device, taken along the line A-A of FIG. 1.

The MEMS device of this embodiment is a MEMS switch. In the MEMS switch, an anchor 2, a stopper 9, a fixed electrode 10, and a set of RF lines 12 are fixed onto a substrate 1. The set of RF lines 12 are located at the furthest distance from the anchor 2. The stopper 9 is located between the anchor 2 and the set of RF lines 12. The fixed electrode 10 is located between the stopper 9 and the set of RF lines 12. The fixed electrode 10 is fixed onto the substrate 1, and has a surface covered with a dielectric film 11.

A movable beam 3 that has one end fixed to the anchor 2 is also provided. The movable beam 3 is a stack structure that is formed with a lower electrode 4, a piezoelectric film 5, an upper electrode 6, and a supporting film 7. The top end on the opposite side from the end fixed to the anchor 2 is the action end. A set of contact electrodes 13 are provided at the action end, so as to face the set of RF lines 12 provided on the substrate 1. A conduction state is created when the contact electrodes 13 are brought into contact with the RF lines 12.

The movable beam 3 forms a piezoelectric actuator. When a piezoelectric driving voltage is applied between the lower electrode 4 and the upper electrode 6, the piezoelectric film 5 expands or contracts, and the movable beam 3 bends upward or downward. The movable beam 3 also functions as an electrostatic actuator. When an electrostatic driving voltage is applied between the fixed electrode 10 and the lower electrode 4 of the movable beam 3, the movable beam 3 is attracted toward the substrate 1.

In this embodiment, the distance from the anchor 2 to the stopper 9 or the distance $k_1$ from the end of the anchor 2 to the center of the stopper 9 is longer than the distance from the stopper 9 to the fixed electrode 10 or the distance $k_2$ from the center of the stopper 9 to the center of the fixed electrode 10. The distance $k_1$ is also longer than the distance from the fixed electrode 10 to the RF lines 12 or the distance $k_3$ from the center of the fixed electrode 10 to the center of the RF lines 12. The distance $k_1$ is also longer than the distance from the stopper 9 to the RF lines 12 or the distance $k_4$ from the center of the stopper 9 to the center of the RF lines 12.

Figure 3:
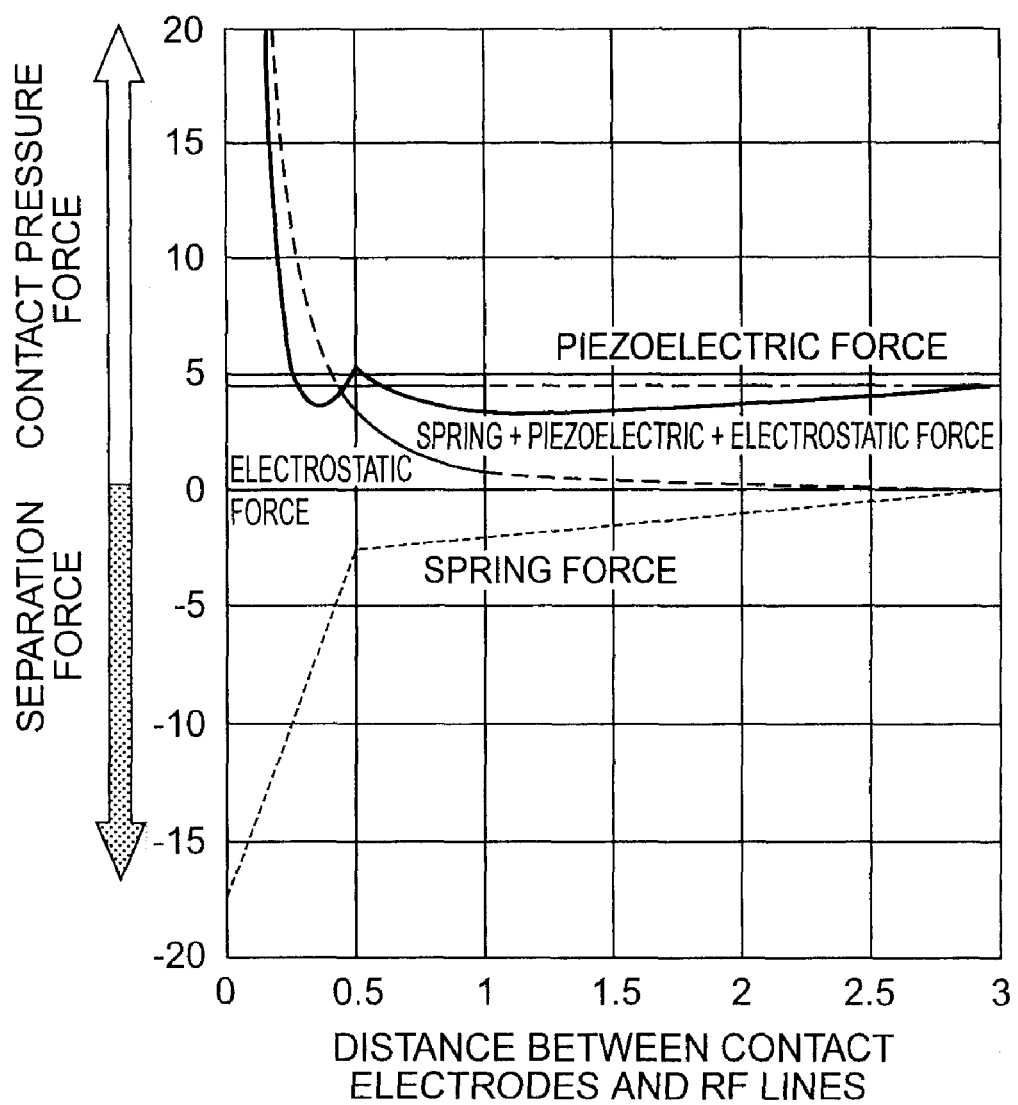
FIG. 3 illustrates the operation of the MEMS device in accordance with the first embodiment.

Referring now to FIG. 3, the operation of the MEMS device or the actions of the movable beam of this embodiment are described in detail. FIG. 3 shows the spring force, the piezoelectric force, and the electrostatic force that are generated in accordance with the distance between the RF lines 12 and the contact electrodes 13, as well as the sum of those forces. In the initial state where an electrostatic driving voltage and a piezoelectric driving voltage are not applied, the distance between the RF lines 12 and the contact electrodes 13 is 3 µm. A predetermined voltage is then applied as an electrostatic or piezoelectric driving voltage. In a case where the distance between the RF lines 12 and the contact electrodes 13 is long, the movable beam 3 is bent downward mainly by a piezoelectric force, and is brought into contact with the stopper 9 formed on the substrate 1. At this point, there is a small space (0.5 µm in the case shown in FIG. 3) formed between the movable beam 3 and the dielectric film 11 covering the fixed electrode 10, and between the RF lines 12 and the contact electrodes 13. Before the movable beam 3 is brought into contact with the stopper 9, the spring constant is small, and the actuation can be performed mainly by a piezoelectric force, since there is a long distance from the movable beam 3 to the contact electrodes 13 serving as the points of action, with the anchor 2 serving as the point of support. In this embodiment, the stopper 9 is first brought into contact with the movable beam 3 when the movable beam 3 is bent downward.

After brought into contact with the stopper 9, the movable beam 3 acts with the stopper 9 that serves as the new point of support. Therefore, the distance from the stopper 9 to the contact electrodes 13 as the points of action becomes shorter than the distance from the anchor 2 to the contact points 13, and the spring constant becomes larger. In this condition, however, there is only a small space between the fixed electrode 10 and the lower electrode 4 of the movable beam 3 with the dielectric film 11 interposed in between. Therefore, a strong electrostatic attraction force is generated to press the contact electrodes 13 against the RF lines 12.

When an electrostatic or piezoelectric driving voltage is removed, a strong separation force with a large spring constant is generated between the contact electrodes 13 and the RF lines 12, and the contact electrodes 13 and the RF lines 12 can be certainly separated from each other.

Figure 16:
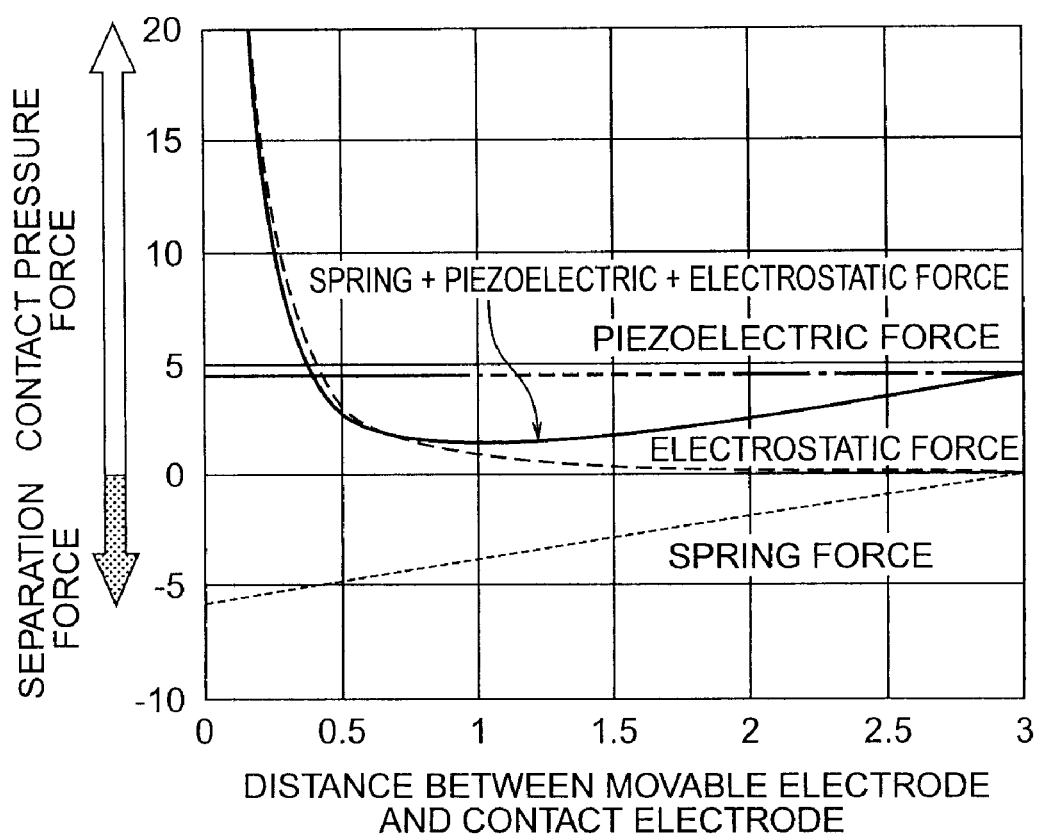
FIG. 16 illustrates the operation of an electrostatically- and piezoelectrically-driven hybrid actuator that is taken as a comparative example.

As a comparative example, another MEMS device was produced. This MEMS device had the same structure as this embodiment, except that the stopper 9 was removed. FIG. 16 shows the actions of the movable beam of the MEMS device of the comparative example. More specifically, in this comparative example, the MEMS device is driven mainly by a piezoelectric force, when the movable beam is away from the fixed electrode. The MEMS device is driven mainly by an electrostatic force, when the movable beam is close to the fixed electrode. Accordingly, it is possible to employ a drive beam having a spring constant that is twice as large as the spring constant obtained in a case where either one of the forces is used. However, this comparative example still has the problem that the separation force is not very strong. To sum up, a MEMS switch of a hybrid drive type using electrostatic and piezoelectric forces has the advantages that the driving voltage is low and the contact pressure force is large, but has the disadvantage that the separation force is rather weak.

As described above, in the MEMS device in accordance with this embodiment, the stopper 9 is provided between the anchor 2 and the fixed electrode 10, so that two-stage operations of an actuator having a small spring constant before the movable beam 3 is brought into contact with the stopper 9 and an actuator having a large spring constant after the contact can be performed. Accordingly, a MEMS device that has a low operation voltage, a large contact pressure force, and a large separation force can be realized. Thus, a MEMS switch of an electrostatically-driven DC contact type with low contact resistance and high reliability can be realized. It is preferable that the location of the stopper 9 is closer to the fixed electrode 10 than to the anchor 2. Also, it is preferable that the height of the stopper 9 standing from the substrate 1 is greater than the total thickness of the fixed electrode 10 and the dielectric film 11.

Referring now to FIGS. 4A to 5B, a method for manufacturing the MEMS device in accordance with this embodiment is described.

Figure 4A:
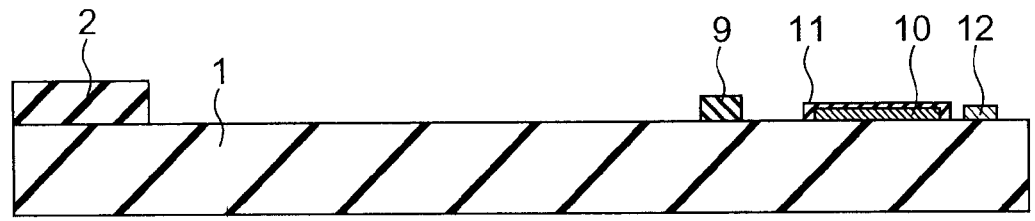
FIGS. 4A to 5B are cross-sectional views illustrating the procedures for manufacturing the MEMS device in accordance with the first embodiment.

First, as shown in FIG. 4A, the anchor 2, the stopper 9, the fixed electrode 10 covered with the dielectric film 11, and the RF lines 12 are formed on the substrate 1 having an insulating surface. Preferred materials for the anchor 2, the stopper 9, and the dielectric film 11 include insulating films such as a silicon nitride or oxide film. The anchor 2, the stopper 9, and the dielectric film 11 can be formed by a known technique such as a lithography technique or reactive ion etching (RIE) technique. The fixed electrode 10 and the RF lines 12 can be made of wiring materials such as Al or noble metals such as Au. If Al is employed, the fixed electrode 10 and the RF lines 12 can be formed by RIE. If a noble metal such as Au is employed, the fixed electrode 10 and the RF lines 12 can be formed by a known lift-off process or the like.

Figure 4B:
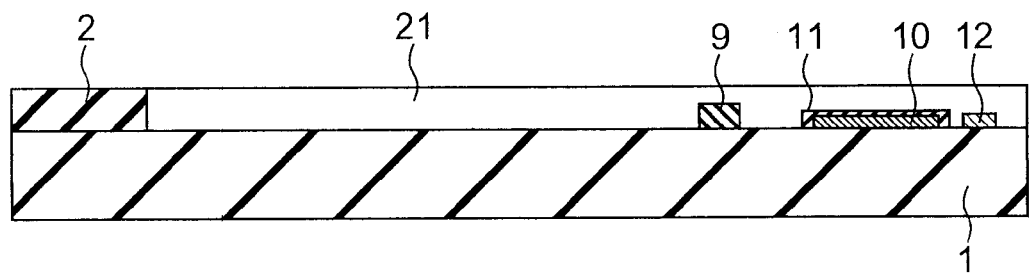

As shown in FIG. 4B, a sacrifice layer 21 is then formed on the surface of the substrate 1, and surface polishing and flattening is performed by a known CMP (Chemical Mechanical Polishing) technique until the anchor 2 is exposed. The sacrifice layer 21 may be made of an inorganic material, a metal material, or an organic material on which selective etching can be performed for another film material. In this embodiment, the sacrifice layer 21 is a polycrystalline silicon layer.

Figure 4C:
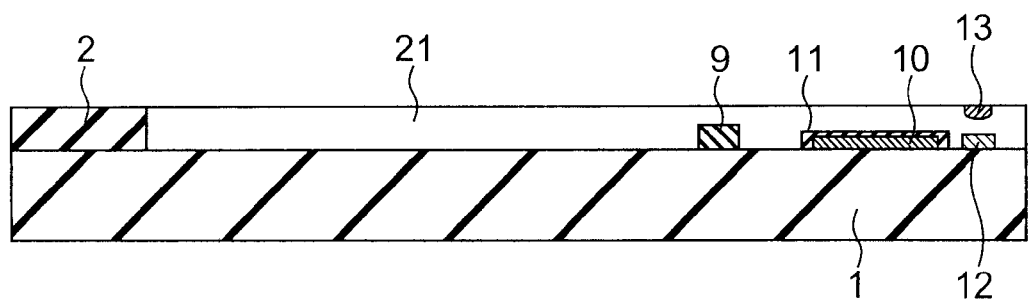

As shown in FIG. 4C, a trench is formed in one region of the sacrifice layer 21 above the RF lines 12, and the contact electrodes 13 are formed in the trench. Here, with the use of a resist for a lift-off process, the procedure for forming the trench by RIE and the procedure for patterning the contact electrodes 13 by lift-off may be carried out in a continuous manner. Alternatively, patterning may be performed to form the trench and the contact electrodes 13 through separate lithographic and etching processes. Preferred materials for the contact electrodes 13 include noble metals such as Au.

Figure 5A:
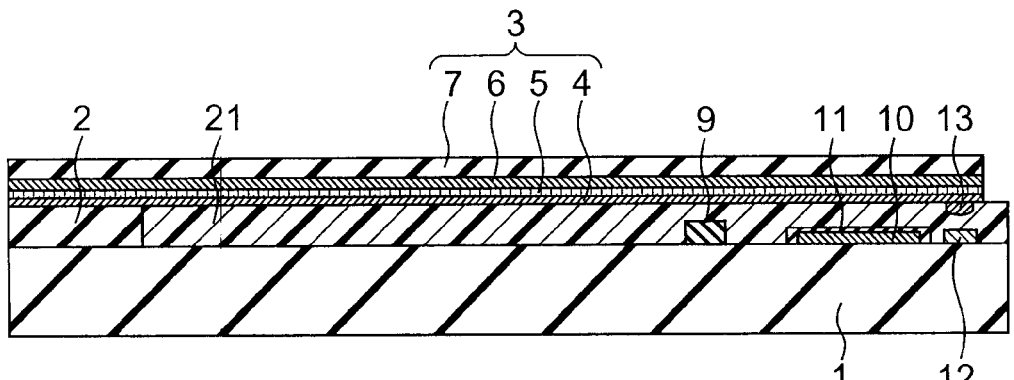

As shown in FIG. 5A, the lower electrode 4, the piezoelectric film 5, the upper electrode 6, and the supporting film 7 of the movable beam 3 are formed one by one on the anchor 2 and the sacrifice layer 21. The lower electrode 4 is formed with an Al film of 200 nm in thickness. The piezoelectric film 5 is an AlN film of 500 nm in film thickness, with the AlN being c-axis oriented. The upper electrode 6 is formed with an Au film of 200 nm in film thickness. The supporting film 7 is formed with a silicon oxide layer of 600 nm in film thickness. The Al, AlN, and Au are processed by a sputtering technique, and the silicon oxide is processed by CVD (Chemical Vapor Deposition). Patterning is then performed on the Al, AlN, Au, and silicon oxide through lithographic and etching processes.

Figure 5B:
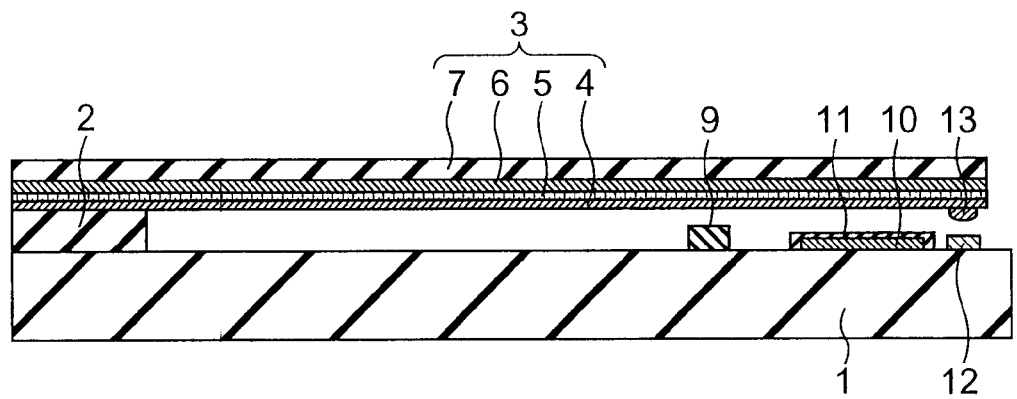

As shown in FIG. 5B, the sacrifice layer 21 is then removed by selective etching with the use of a $XeF_2$ gas as the etching gas, and the hybrid driving mechanism 3 is formed. In this manner, the MEMS device of this embodiment is completed.

(First Modification)

Figure 6:
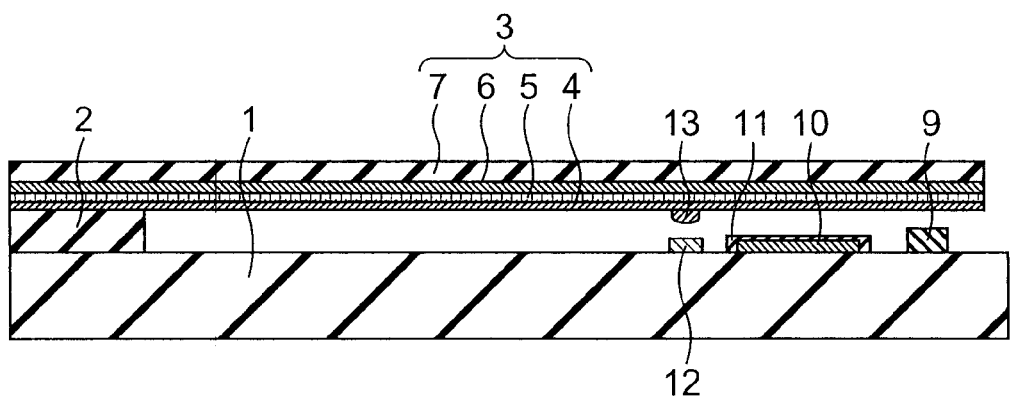
FIG. 6 is a cross-sectional view of the MEMS device in accordance with a first modification of the first embodiment.

FIG. 6 is a cross-sectional view of a MEMS device in accordance with a first modification of this embodiment. The hybrid actuator of this modification is a MEMS switch that is the same as the MEMS switch of the first embodiment, except that the positions of the stopper 9 and the RF lines 12 are replaced with each other. More specifically, the RF lines 12 are located between the anchor 2 and the fixed electrode 10. The stopper 9 is located on the opposite side of the fixed electrode 10 from the anchor 2. The anchor 2, the RF lines 12, the fixed electrode 10, and the stopper 9 are arranged in this order. In this modification, the contact electrodes 13 are positioned to face the RF lines 12.

Like the first embodiment, this modification can provide a MEMS device having a low operation voltage, a large contact pressure force, and a large separation force. Thus, a MEMS switch of an electrostatically-driven DC contact type with low contact resistance and high reliability can be realized.

(Second Modification)

Figure 7:
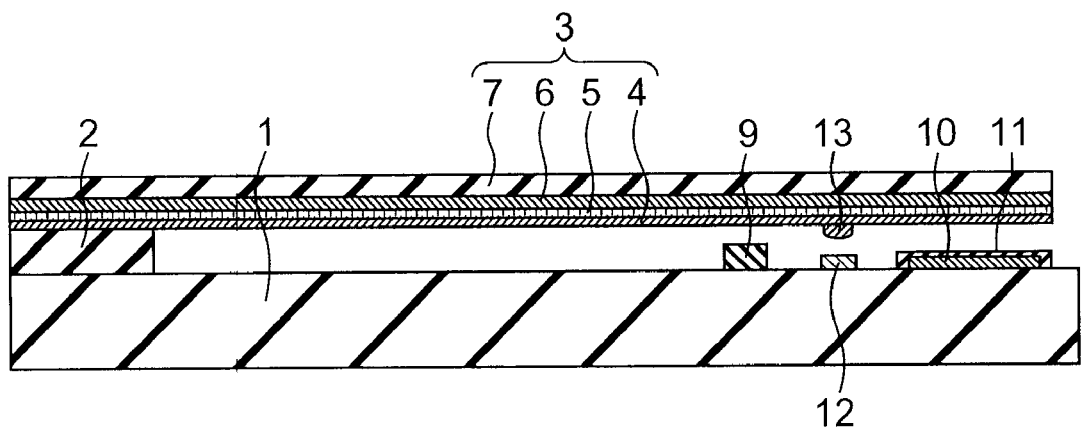
FIG. 7 is a cross-sectional view of the MEMS device in accordance with a second modification of the first embodiment.

FIG. 7 is a cross-sectional view of a MEMS device in accordance with a second modification of this embodiment. The hybrid actuator of this modification is a MEMS switch that is the same as the MEMS switch of the first embodiment, except that the positions of the fixed electrode 10 and the RF lines 12 are replaced with each other. More specifically, the RF lines 12 are located between the stopper 9 and the fixed electrode 10. The anchor 2, the stopper 9, the RF lines 12, and the fixed electrode 10 are arranged in this order. In this modification, the contact electrodes 13 are positioned to face the RF lines 12.

Like the first embodiment, this modification can provide a MEMS device having a low operation voltage, a large contact pressure force, and a large separation force. Thus, a MEMS switch of an electrostatically-driven DC contact type with low contact resistance and high reliability can be realized.

(Third Modification)

Figure 8:
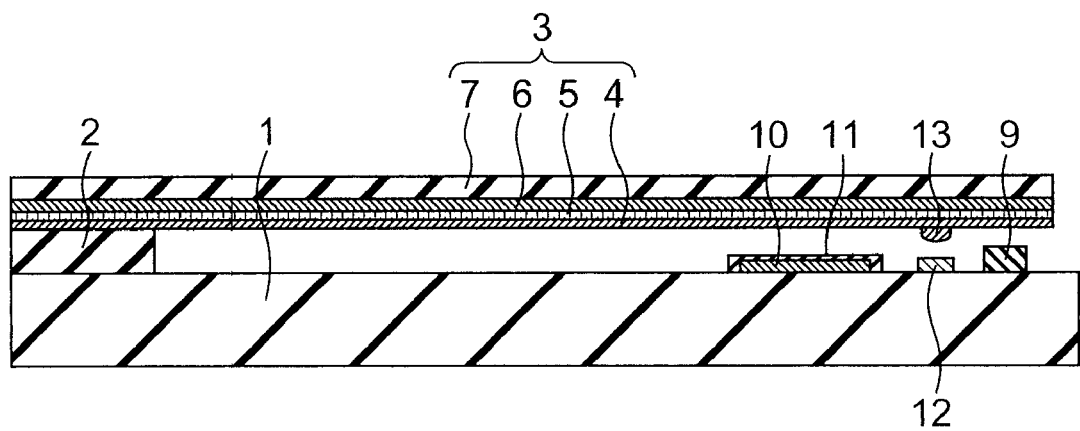
FIG. 8 is a cross-sectional view of the MEMS device in accordance with a third modification of the first embodiment.

FIG. 8 is a cross-sectional view of a MEMS device in accordance with a third modification of this embodiment. The hybrid actuator of this modification is a MEMS switch that is the same as the MEMS switch of the first modification, except that the positions of the fixed electrode 10 and the RF lines 12 are replaced with each other. More specifically, the RF lines 12 are located between the stopper 9 and the fixed electrode 10. The anchor 2, the fixed electrode 10, the RF lines 12, and the stopper 9 are arranged in this order. In this modification, the contact electrodes 13 are positioned to face the RF lines 12.

Like the first modification, this modification can provide a MEMS device having a low operation voltage, a large contact pressure force, and a large separation force. Thus, a MEMS switch of an electrostatically-driven DC contact type with low contact resistance and high reliability can be realized.

Figure 17:
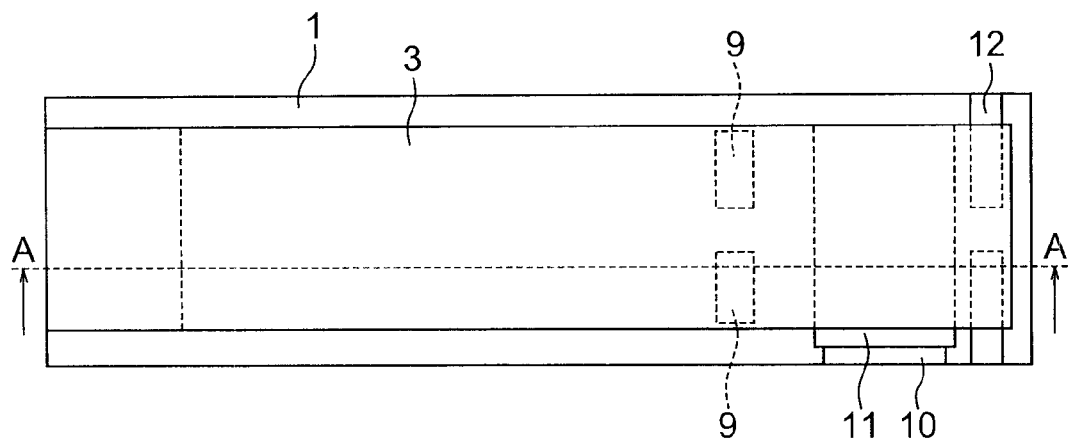
FIG. 17 is a plan view of a MEMS device in accordance with a fourth modification of the first embodiment.
Figure 18:
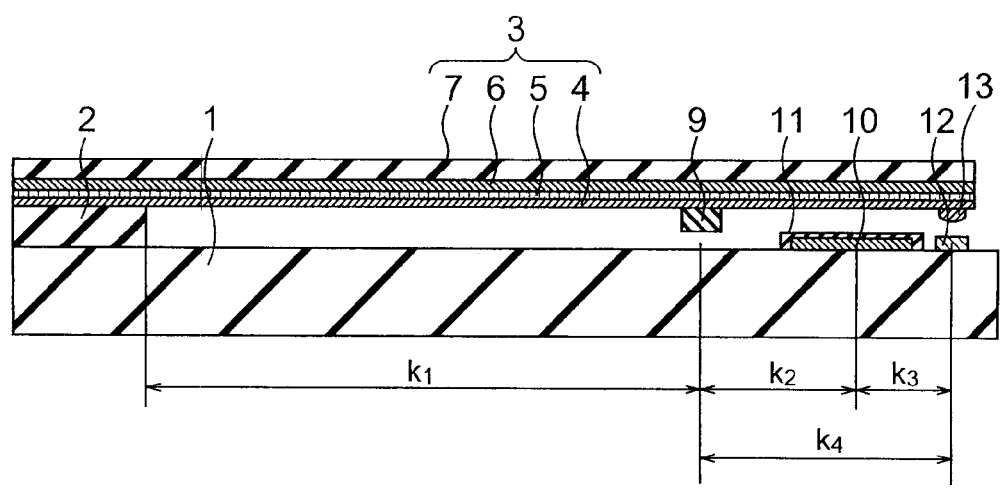
FIG. 18 is a cross-sectional view of the MEMS device in accordance with a fifth modification of the first embodiment.

As a fourth modification of this embodiment shown in FIG. 17, a plurality of stoppers 9 can be provided. And as a fifth modification of this embodiment shown in FIG. 18, a stopper 9 can be provided on the movable beam 3 so as to face the substrate. In the fifth modification, the stopper 9 is first brought into contact with the substrate 1 when the movable beam 3 is bent downward.

Second Embodiment

Figure 9:
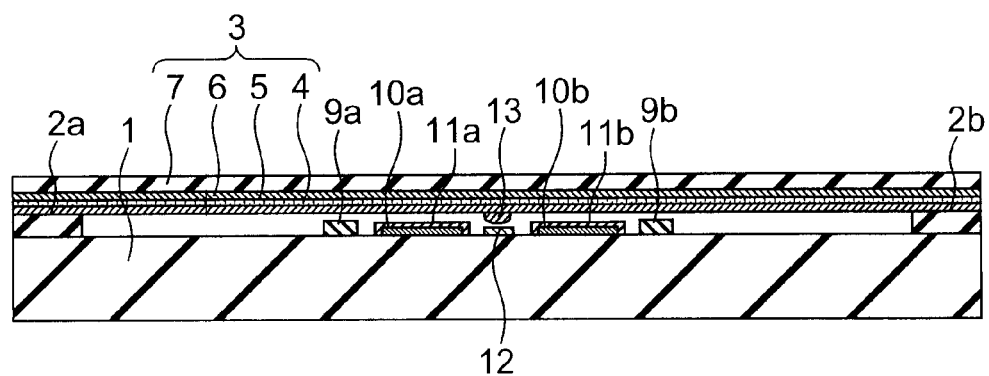
FIG. 9 is a cross-sectional view of the MEMS device in accordance with a second embodiment.

FIG. 9 is a cross-sectional view of a MEMS device in accordance with a second embodiment of the present invention. The MEMS device of the first embodiment is a MEMS switch, and the movable beam 3 is a cantilever. In the MEMS device of this embodiment, on the other hand, the movable beam 3 has both ends supported. Therefore, a pair of anchors 2a and 2b separated from each other are provided on the substrate 1, and a set of RF lines 12 are provided between the anchor 2a and the anchor 2b on the substrate 1. A stopper 9a is provided between the anchor 2a and the RF lines 12 on the substrate 1. A fixed electrode 10a having a surface covered with a dielectric film 11a is provided between the stopper 9a and the RF lines 12 on the substrate 1. Further, a stopper 9b is provided between the anchor 2b and the RF lines 12 on the substrate 1, and a fixed electrode 10b having a surface covered with a dielectric film 11b is provided between the stopper 9b and the RF lines 12 on the substrate 1.

Like the movable beam 3 of the first embodiment, the movable beam 3 of this embodiment has a stack structure formed with a lower electrode 4, a piezoelectric film 5, an upper electrode 6, and a supporting film 7. The two ends of the movable beam 3 are supported by the anchors 2a and 2b. Contact electrodes 13 are also provided at the center of the movable beam 3 serving as the point of action, so as to face the RF lines 12.

As in the first embodiment, the distance from the anchor 2a to the stopper 9a is longer than the distance from the stopper 9a to the fixed electrode 10a, the distance from the fixed electrode 10a to the RF lines 12, and the distance from the stopper 9a to the RF lines 12 in this embodiment. Likewise, the distance from the anchor 2b to the stopper 9b is longer than the distance from the stopper 9b to the fixed electrode 10b, the distance from the fixed electrode 10b to the RF lines 12, and the distance from the stopper 9b to the RF lines 12 in this embodiment.

Like the first embodiment, this embodiment having the above structure can provide a MEMS device having a low operation voltage, a large contact pressure force, and a large separation force. Thus, a MEMS switch of an electrostatically-driven DC contact type with low contact resistance and high reliability can be realized.

As in each of the modifications of the first embodiment, the positions of the stoppers, the fixed electrodes, and the RF lines may be replaced with one another in this embodiment.

In this embodiment, a plurality of stoppers 9 can be provided as in fourth modification of the first embodiment. And a stopper 9 can be provided on the movable beam 3 so as to face the substrate as in fifth modification of the first embodiment. In this case, the stopper 9 is first brought into contact with the substrate 1 when the movable beam 3 is bent downward.

Third Embodiment

Figure 10:
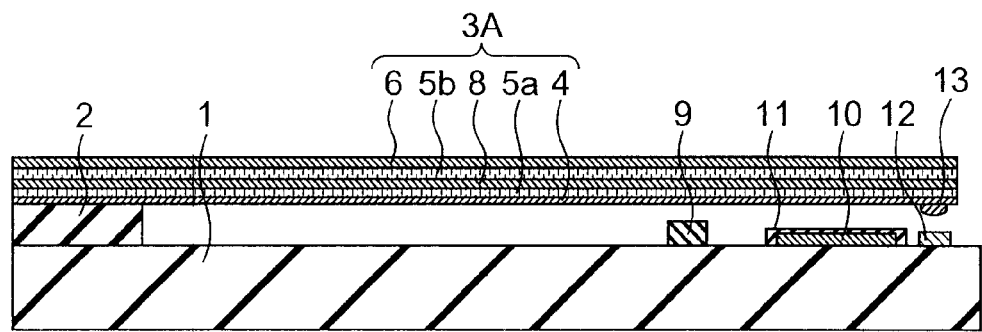
FIG. 10 is a cross-sectional view of the MEMS device in accordance with a third embodiment.

FIG. 10 is a cross-sectional view of a MEMS device in accordance with a third embodiment of the present invention. The MEMS device of this embodiment is a MEMS switch that is the same as the MEMS switch of the first embodiment, except that the movable beam 3 of the first embodiment having a monomorph structure is replaced with a movable beam 3A having a bimorph structure. This movable beam 3A has a stack structure formed with a lower electrode 4, a first piezoelectric film 5a, an intermediate electrode 8, a second piezoelectric film 5b, and an upper electrode 6. When a piezoelectric driving voltage is applied to the lower electrode 4, the intermediate electrode 8, and the upper electrode 6, the piezoelectric films 5a and 5b expand and contract, and the movable beam 3A bends upward and downward. The movable beam 3A also functions as an electrostatic actuator. When an electrostatic driving voltage is applied between the fixed electrode 10 and the lower electrode 4 of the movable beam 3A, the movable beam 3A is attracted toward the substrate 1.

Like the first embodiment, this embodiment having the above structure can provide a MEMS device having a low operation voltage, a large contact pressure force, and a large separation force. Thus, a MEMS switch of an electrostatically-driven DC contact type with low contact resistance and high reliability can be realized.

The movable beams having a bimorph structure of this embodiment can also be employed in the MEMS device of the second embodiment and the MEMS device of the later described fourth embodiment.

As in each of the modifications of the first embodiment, the positions of the stopper, the fixed electrode, and the RF lines may be replaced with one another in this embodiment.

In this embodiment, a plurality of stoppers 9 can be provided as in fourth modification of the first embodiment. And a stopper 9 can be provided on the movable beam 3 so as to face the substrate as in fifth modification of the first embodiment. In this case, the stopper 9 is first brought into contact with the substrate 1 when the movable beam 3 is bent downward.

Fourth Embodiment

Figure 11:
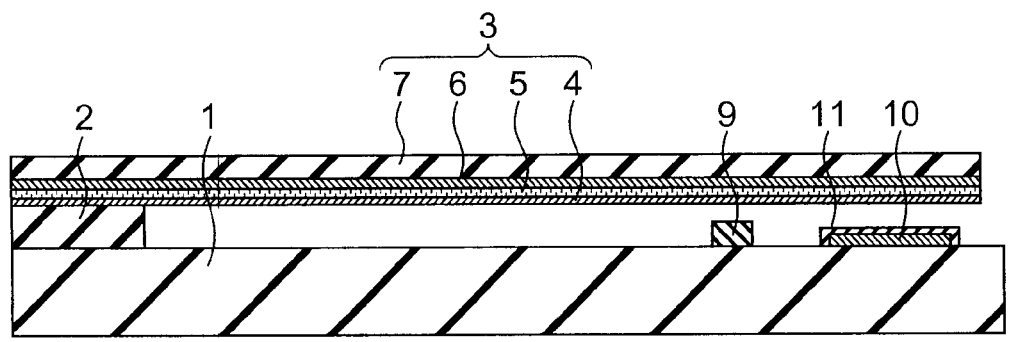
FIG. 11 is a cross-sectional view of the MEMS device in accordance with a fourth embodiment.

FIG. 11 is a cross-sectional view of a MEMS device in accordance with a fourth embodiment of the present invention. The MEMS device of this embodiment is a variable capacitor, and is the same as the MEMS device of the first embodiment, except that the RF lines 12 and the contact electrodes 13 are eliminated. Accordingly, as in the first embodiment, the distance from the anchor 2 to the stopper 9 is longer than the distance from the stopper 9 to the fixed electrode 10 in this embodiment.

As in the first embodiment, in the variable capacitor of this embodiment, the stopper 9 is provided between the anchor 2 and the fixed electrode 10, so that two-stage operations of an actuator having a small spring constant before the movable beam 3 is brought into contact with the stopper 9 and an actuator having a large spring constant after the contact can be performed. Accordingly, a MEMS device that has a low operation voltage, a large contact pressure force, and a large separation force can be realized. Thus, a variable capacitor with a large contact capacity and high reliability can be realized. In this embodiment, the positions of the stopper 9 and the fixed electrode 10 may be replaced with each other.

Figure 12:
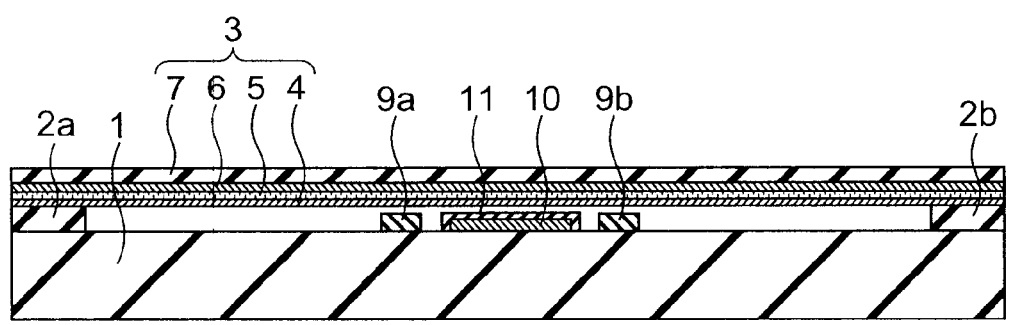
FIG. 12 is a cross-sectional view of the MEMS device in accordance with a modification of the fourth embodiment.

Although the movable beam is of a cantilever type in this embodiment, the movable beam may have both ends supported. In such a case, the fixed electrode 10 having a surface covered with the dielectric film 11 is provided at the mid point between anchors 2a and 2b, and stoppers 9a and 9b are provided on both sides of the fixed electrode 10, as shown in FIG. 12.

In this embodiment, a plurality of stoppers 9 can be provided as in fourth modification of the first embodiment. And a stopper 9 can be provided on the movable beam 3 so as to face the substrate as in fifth modification of the first embodiment. In this case, the stopper 9 is first brought into contact with the substrate 1 when the movable beam 3 is bent downward.

Fifth Embodiment

Figure 13:
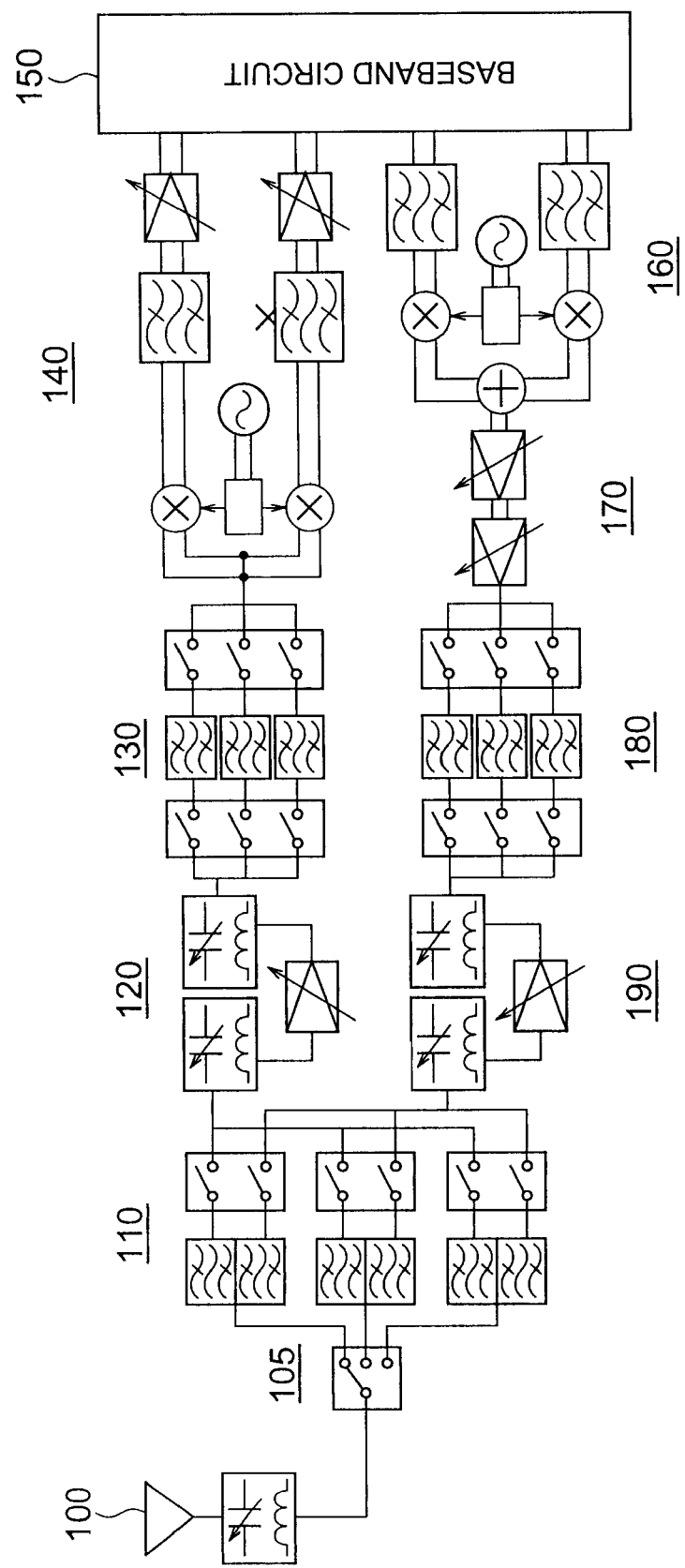
FIG. 13 is a block diagram of a portable communication terminal in accordance with a fifth embodiment.
Figure 14:
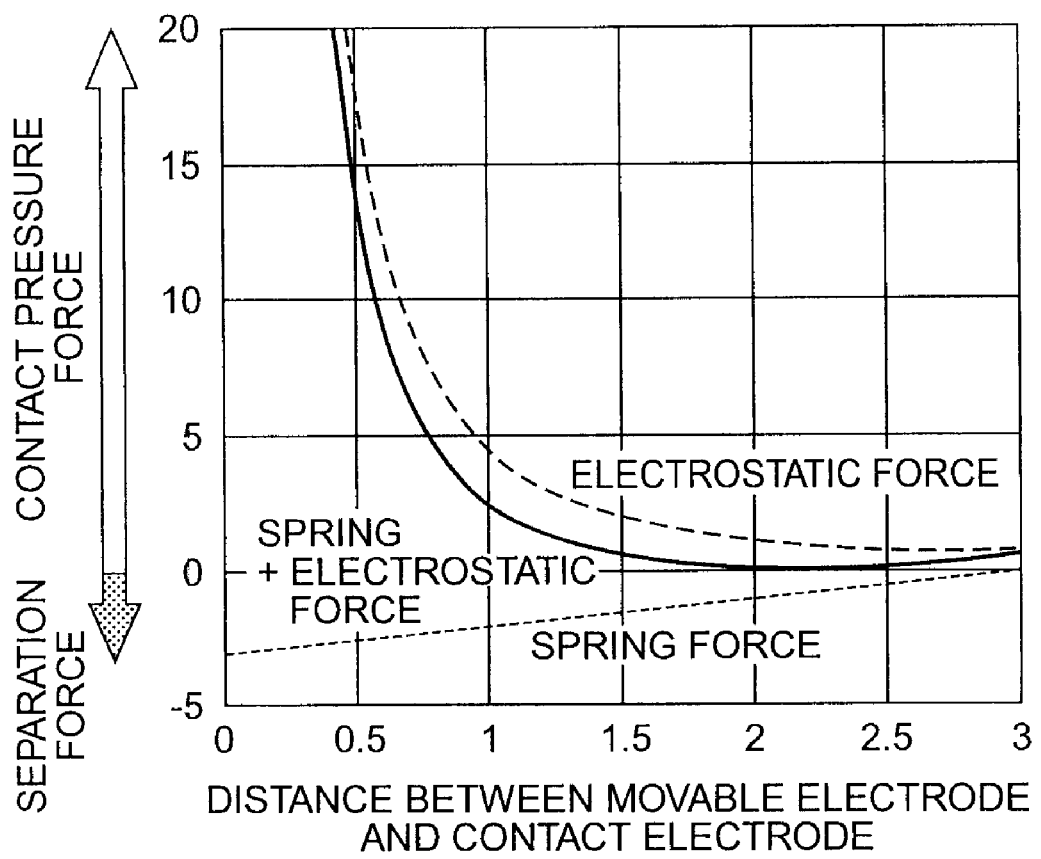
FIG. 14 illustrates the operation of a conventional electrostatically-driven actuator.
Figure 15:
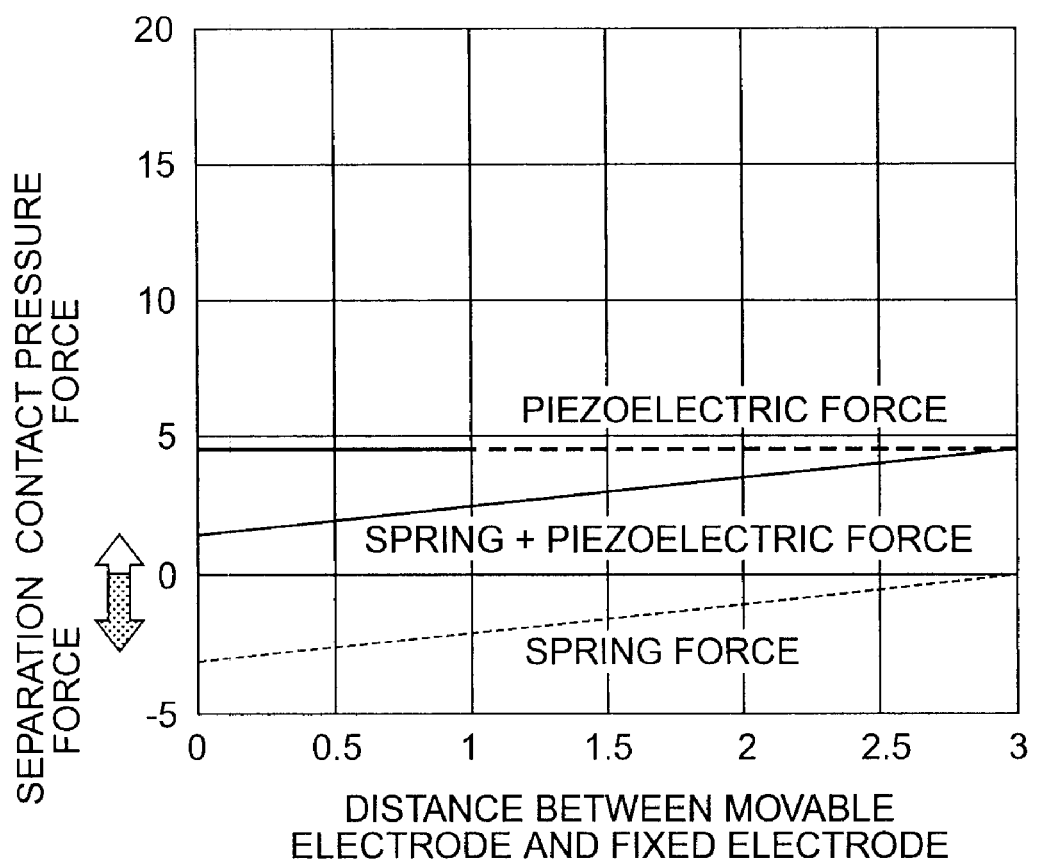
FIG. 15 illustrates the operation of a conventional piezoelectrically-driven actuator.

FIG. 13 is a block diagram of a portable communication terminal in accordance with a fifth embodiment of the present invention. The portable communication terminal of this embodiment includes a variable antenna 100, an antenna switch 105, a filter bank 110, a variable low-noise amplifier 120, a filter bank 130, an orthogonal demodulator 140, a baseband circuit 150, an orthogonal modulator 160, a driver amplifier 170, a filter bank 180, and a variable power amplifier 190. The variable low-noise amplifier 120, the filter bank 130, and the orthogonal demodulator 140 form a receiving circuit. The orthogonal modulator 160, the driver amplifier 170, the filter bank 180, and the variable power amplifier 190 form a transmitting circuit. The variable low-noise amplifier 120 has two variable matching boxes and a low noise amplifier, and the variable power amplifier has two variable matching boxes and a power amplifier.

The hybrid actuator of one of the first through third embodiments is used as a RF switch in each of the antenna switch 105 and the filter banks 110 and 130. The variable capacitor of the fourth embodiment is used for the variable antenna 100, the variable low-noise amplifier 120, and the variable power amplifier 190.

As described above, highly reliable RF switches and variable capacitors are employed in this embodiment. Accordingly, a highly reliable portable communication terminal can be obtained.

As described so far, each embodiment of the present invention can provide a MEMS device having a low operation voltage and large contact pressure and separation forces. Accordingly, it is possible to provide a highly reliable MEMS switch of a DC contact type with a low operation voltage and low contact resistance, and a highly reliable variable capacitor with a low operation voltage and a high capacity variation rate.

The contact electrodes 13 may be electrodes having contact lines or contact faces. The RF lines 12 may not necessarily be of a linear type, but may be of a pad type or the like. In the above embodiments, each set of RF lines is formed with two RF lines. However, each set of RF lines may be formed with a single RF line or more than two RF lines. Also, the RF lines 12 may not necessarily be RF lines, but may be DC lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A MEMS device comprising:
a substrate;
a supporting unit provided on the substrate;
a fixed electrode provided on the substrate;
an actuator including a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode;

only one stopper unit located above a straight line connecting the supporting unit and the fixed electrode, and being located on the substrate so as to face the first electrode;
a first contact electrode provided on the substrate; and
a second contact electrode provided on the actuator so as to face the first contact electrode, wherein:

the stopper unit is provided between the supporting unit and the fixed electrode; and the first contact electrode is located on the straight line connecting the supporting unit and the fixed electrode, and is located on the opposite side of the fixed electrode from the stopper unit.

2. The device according to claim 1, wherein the distance from the supporting unit to the stopper unit is longer than the distance from the stopper unit to the fixed electrode.

3. The device according to claim 1, wherein the actuator further includes a second piezoelectric film formed on the second electrode, and a third electrode formed on the second piezoelectric film.

4. The device according to claim 1, wherein the distance from the supporting unit to the stopper unit is longer than the distance from the stopper unit to the first contact electrode.

5. A portable communication terminal comprising the MEMS device according to claim 1, the MEMS device serving as a RF switch or a variable capacitor.

6. A MEMS device comprising:
a substrate;
a supporting unit provided on the substrate;
a fixed electrode provided on the substrate;
an actuator including a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode;
only one stopper unit located above a straight line connecting the supporting unit and the fixed electrode, and being located on the substrate so as to face the first electrode;
a first contact electrode that is provided on the substrate; and
a second contact electrode that is provided on the actuator so as to face the first contact electrode, wherein:

the fixed electrode is provided between the supporting unit and the stopper unit; and the first contact electrode is provided on the straight line connecting the supporting unit and the fixed electrode, and is located on the opposite side of the fixed electrode from the stopper unit.

7. The device according to claim 6, wherein the distance from the supporting unit to the stopper unit is longer than the distance from the stopper unit to the fixed electrode.

8. The device according to claim 6, wherein the actuator further includes a second piezoelectric film formed on the second electrode, and third electrode formed on the second piezoelectric film.

9. The device according to claim 6, wherein the distance from the supporting unit to the stopper unit is longer than the distance from the stopper unit to the first contact electrode.

10. A MEMS device comprising:
a substrate;
a supporting unit provided on the substrate;
a fixed electrode provided on the substrate;
an actuator including a first electrode, a first piezoelectric film formed on the first electrode, and a second electrode formed on the first piezoelectric film, one end of the actuator being fixed onto the substrate with the supporting unit, the actuator extending in a direction connecting the supporting unit and the fixed electrode, the first electrode being located to face the fixed electrode;
only one stopper unit located above a straight line connecting the supporting unit and the fixed electrode, and being located on the substrate so as to face the first electrode;
a first contact electrode provided between the stopper unit and the fixed electrode on the substrate; and
a second contact electrode provided on the actuator so as to face the first contact electrode.

11. The device according to claim 10, wherein the distance from the supporting unit to the stopper unit is longer than the distance from the stopper unit to the fixed electrode.

12. The device according to claim 10, wherein the actuator further includes a second piezoelectric film formed on the second electrode, and a third electrode formed on the second piezoelectric film.

13. The device according to claim 10, wherein the distance from the supporting unit to the stopper unit is longer than the distance from the stopper unit to the first contact electrode.

14. A MEMS device comprising:
a substrate;
first and second supporting units that are provided at a distance from each other on the substrate;
a first fixed electrode that is provided between the first supporting unit and the second supporting unit on the substrate;
a second fixed electrode that is provided between the first fixed electrode and the second supporting unit on the substrate;
a first contact electrode that is provided between the first fixed electrode and the second fixed electrode;
a first stopper unit that is located above a straight line connecting the first supporting unit and the second supporting unit, and is located on the opposite side of the first fixed electrode from the first contact electrode on the substrate;
a second stopper unit that is located above the straight line connecting the first supporting unit and the second supporting unit, and is located on the opposite side of the second fixed electrode from the first contact electrode on the substrate;
an actuator that includes a first electrode, a first piezoelectric film formed on the first electrode, and a second electrode formed on the first piezoelectric film, the actuator having two ends fixed onto the substrate with the first and second supporting units; and
a second contact electrode that is provided on the actuator so as to face the first contact electrode.

* * * * *